United States Patent [19]

Ito

[11] Patent Number: 5,270,235
[45] Date of Patent: Dec. 14, 1993

[54] SEMICONDUCTOR DEVICE FABRICATION

[75] Inventor: Mitsuaki Ito, Nagano, Japan

[73] Assignee: Seiko Epson Corporation, Tokyo, Japan

[21] Appl. No.: 292,757

[22] Filed: Jan. 3, 1989

[30] Foreign Application Priority Data

Jan. 6, 1988 [JP] Japan ............................ 63-000305
Aug. 26, 1988 [JP] Japan ............................ 63-211638

[51] Int. Cl.$^5$ ............................ H01L 21/265
[52] U.S. Cl. ............................ 437/45; 437/40; 437/913; 148/DIG. 82
[58] Field of Search ............. 437/45, 7, 8, 40, 44, 437/913; 357/23.5, 23.12

[56] References Cited

U.S. PATENT DOCUMENTS 4,112,455 9/1978 Seliger et al. .................. 437/45
4,514,893 5/1985 Kinsbron et al. ................ 29/571

FOREIGN PATENT DOCUMENTS 0073623 3/1983 European Pat. Off.
2047777 9/1965 Fed. Rep. of Germany.
0008879 1/1981 Japan.

OTHER PUBLICATIONS

"Improved Short-Channel Characteristics in Boron-Implanted N-Channel MOSFETs", *Gel Journal of Research*, A. G. Lewis, et al., vol. 1 (1983), No. 3, pp. 157–173.
"Device Design Considerations for Ion Implanted n--Channel MOSFETs", *Ion Implanted Mosfets*, V. L. Rideout, et al., pp. 50–59.
Sze, S. M., *Physics of Semiconductor Devices*, Wiley-Interscience Publication, John Wiley & Sons, 1981, pp. 446–475.
Troutman, "Subthreshold slope for Insulated gate Field Effect Transistors", IEEE Trans. Elec. Devs., Nov. 1975, pp. 1049–1051.
Brews, "Subthreshold Behavior of Uniformly and Non-uniformly Doped Long-channel MOSFET", IEEE Trans. Elec. Devs., vol. 26, No. 9, Sep. 1979 pp. 1282–1291.
Schmitz et al., "Design, Modeling, and Fabrication of Subhalf-Micrometer CMOS Transistors", IEEE Trans. Elec. Devs., vol. Ed 33, No. 1 Jan. 1986, pp. 148–153.

*Primary Examiner*—Brian E. Hearn
*Assistant Examiner*—Tuan Nguyen
*Attorney, Agent, or Firm*—Spensley Horn Jubas & Lubitz

[57] ABSTRACT

In the fabrication of an MIS transistor, the distribution characteristic of the impurity density with respect to the depth of the first region exhibited when the amount of ions implanted for channel doping is varied is first determined. The swing value is calculated from the gate voltage - drain current characteristic on the basis of the distribution characteristic obtained. Ions are implanted to the channel portion at a dose which is selected in accordance with the impurity density of the first region so that the swing value takes the minimum value or a value as small as possible, thereby producing an MIS type semiconductor device having a channel doping structure in a first region between a source and a drain.

4 Claims, 7 Drawing Sheets

P- TYPE CHANNEL TRANSISTOR HAVING THRESHOLD VOLTAGE OF - 0.5V

1: LOGARITHM OF DRAIN CURRENT, GATE VOLTAGE = 0
SWING = 100 MV/DECADE

2: LOGARITHM OF DRAIN CURRENT, GATE VOLTAGE = 0
SWING = 90 MV/DECADE

3: LOGARITHM OF DRAIN CURRENT, GATE VOLTAGE = 0
SWING = 80 MV/DECADE

SEMICONDUCTOR DEVICE FABRICATION

BACKGROUND OF THE INVENTION

1. Field of the Invention

The present invention to relates to a method of producing a metal insulator semiconductor (hereinunder referred to as "MIS") type semiconductor device having a doped channel structure.

2. Description of the Prior Art

In an MIS type semiconductor device having a doped channel structure, the threshold gate voltage is generally adjusted by controlling the amount of ions implanted for channel doping with respect to the impurity density of the impurities of the substrate. That is, channel doping for controlling the threshold voltage by selectively implanting the ions of impurities in the channel region of an MIS transistor makes best use of the good controlling property of low-density doping. In this case, the threshold voltage is determined in accordance with the supply voltage, and the lower limit value of the threshold voltage is determined in accordance with the consumption of current during a rest, i.e., when the device is in the operating state in which it experiences minimum power consumption. However, the amount of channel doping ions implanted for adjusting the threshold voltage is determined not in consideration of the swing, which exerts a great influence on the consumption of current during a rest, but merely in conformity with the threshold voltage value. The term "swing" refers to the change in the gate voltage which is required for changing the value of the drain current by one order of magnitude, i.e., by a factor of 10, in the region below the threshold voltage.

The swing and the drain current flowing when the gate voltage is 0 V, namely, the cut-off current, are explained in detail in the text *Physics of Semiconductor Devices* by Sze. S. M., published by John Wiley Interscience (1981).

If the quantity of ions implanted for channel doping is determined only on the basis of the threshold value without taking the swing into consideration, as in conventional manufacturing methods, the swing takes on a large value and the cut-off current value increases, thereby greatly increasing the consumption of current during a rest. This tendency is prominent in an MIS type transistor having a short channel.

In addition, since demand for reduced power consumption has recently become strong, as well as demand for ICs of higher integration and higher capacity, reduction in the consumption of current during a rest by reducing the cut-off current has become a very important aim to be achieved.

SUMMARY OF THE INVENTION

Accordingly, it is an object of the present invention to eliminate the above-described problems in the prior art and to provide a method of producing an MIS type semiconductor device in which the amount of ions implanted for channel doping is controlled so as to regulate the increase in consumption of current during a rest, due to the increase in the cut-off current, to a small value in consideration of the swing.

To achieve this aim, the present invention provides a method of producing a semiconductor device which is applicable to an MIS type semiconductor device having a channel doping structure in a first region between a source region and a drain region, and which comprises the steps of: determining the distribution characteristic of the impurity density with respect to the depth of the first region exhibited when the amount of ions implanted for channel doping is varied; determining the swing value by calculating, for instance the result of simulation of drain current in the subthreshold region on the basis of the above distribution characteristic, or by calculating, for instance, the result of observation from the gate voltage-drain current characteristic on the basis of the distribution characteristic; and implanting ions in the channel portion at a dose which is selected in accordance with the impurity density of the first region so that the swing value is minimized.

The above and other objects, features and advantages of the present invention will become clear from the following description of the preferred embodiment thereof, taken in conjunction with the accompanying drawings.

DESCRIPTION OF THE PREFERRED

Figure 1A:
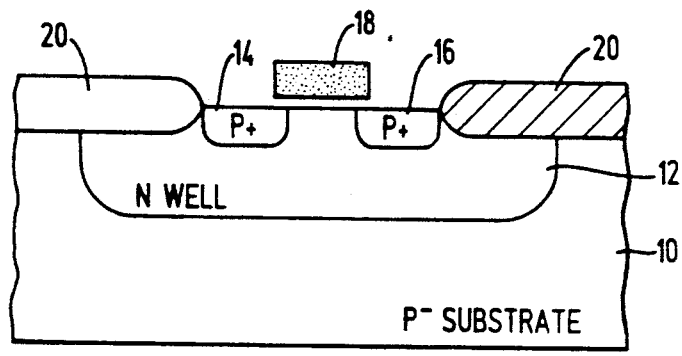
FIGS. 1a, 1b and 1c are schematic views of three integrated circuit structures serving to illustrate the purpose of the invention.
Figure 1B:
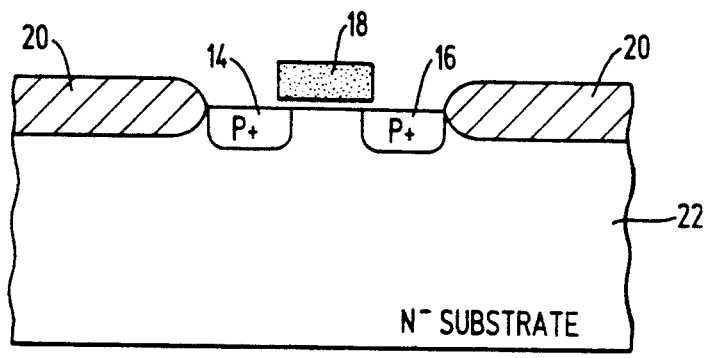
Figure 1C:
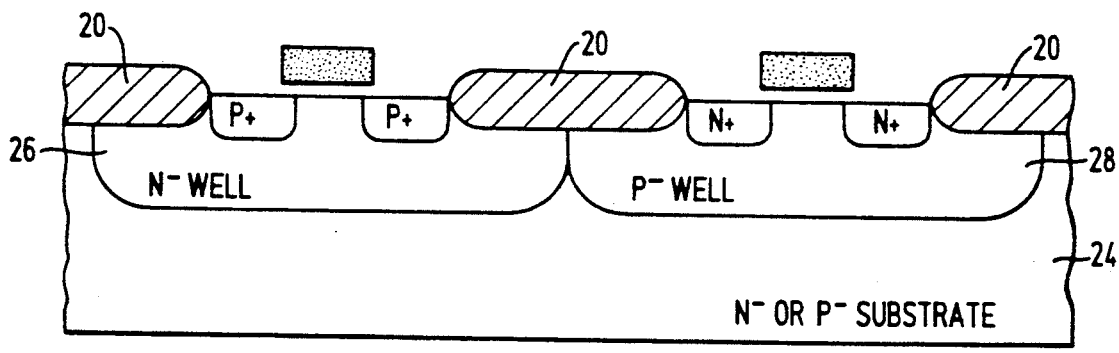

FIGS. 1a, 1b and 1c illustrate various types of MIS devices to which the present invention can be applied. In FIG. 1a, a p− substrate 10 is provided with an n well 12 in which a p channel transistor is formed. This transistor includes p+ source and drain regions 14 and 16 separated by n-type material over which is disposed a p+ polysilicon gate electrode 18 which is insulated from region 12 by an insulating layer (not shown). Isolation for the transistor is provided by an insulating layer 20.

The transistor shown in FIG. 1b differs from that of FIG. 1a in that it is formed in an n− substrate 22, so that no n well is required.

FIG. 1c illustrates a CMOS device composed of a p channel transistor and an n channel transistor formed in a substrate 24 that can be of either n− or p− type. Substrate 24 is provided with at least one of an n− well 26 in which p+ source and drain regions of the p channel transistor are formed, and a p− well 28 in which n+ source and drain regions of an n channel transistor are formed, each transistor having an associated insulated gate electrode and being surrounded by insulating layer 20.

An embodiment of the present invention will be described with reference to a few characteristic curves relating to the method of the present invention. A p+ polycrystalline Si gate p-type channel MIS type transistor will be cited as an example. The MIS type transistor has a channel doping structure in which the channel is doped with boron, i.e., first conduction, or p-type impurities which are of a heteropolar type with respect to an n well having second conduction type impurities formed in the first conduction type p-type Si substrate.

Figure 3:
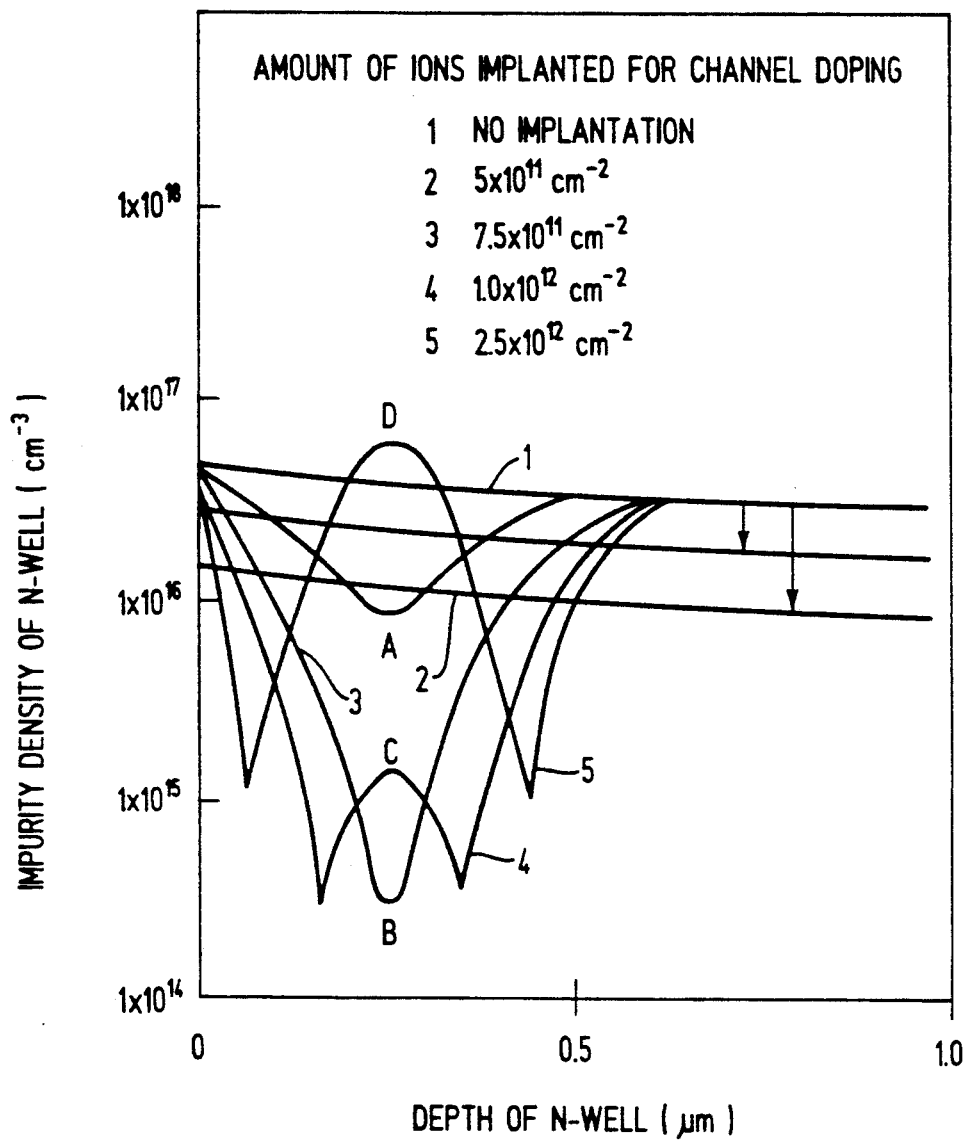
FIG. 3 is a diagram showing the relationship between the depth and the impurity density of an n well exhibited when the amount of ions implanted for channel doping is varied.

FIG. 3 shows the results of simulation of the profile of the impurity density in the direction of the depth of the n well obtained when the amount of ions implanted for channel doping is varied from 0, represented by linear curve 1, to $2.5 \times 10^{12}$ cm$^{-2}$, represented by curve 5, while making the accelerating energy constant in the step of implanting channel doping ions. In FIG. 3, the abscissa represents the depth of the n well, and the ordinate represents the impurity density of the n well.

The relation between the amount of ions implanted and the resulting impurity density depends on conductivity type of the implanted ions relative to that of the substrate. If the conductivity types are the same, the impurity density increases in proportion to the amount of ions implanted; if the conductivity types are opposite one another, an inverse proportion exists.

As is obvious from FIG. 3, in the case of channel doping of heteropolar type impurities, the impurity density of the n well gradually decreases, with the center at which the peak (A, B) of the impurity distribution appears at the time of the implantation of the ions decreasing, with increases in the amount of ions implanted. As a result, depressions A and B are formed. When a predetermined amount of ions is implanted, the peaks of boron, namely p-type, appear in the n well and these peaks C and D become higher with increases in the amount of ions implanted, thereby constituting what is called a buried channel structure.

Figure 2:
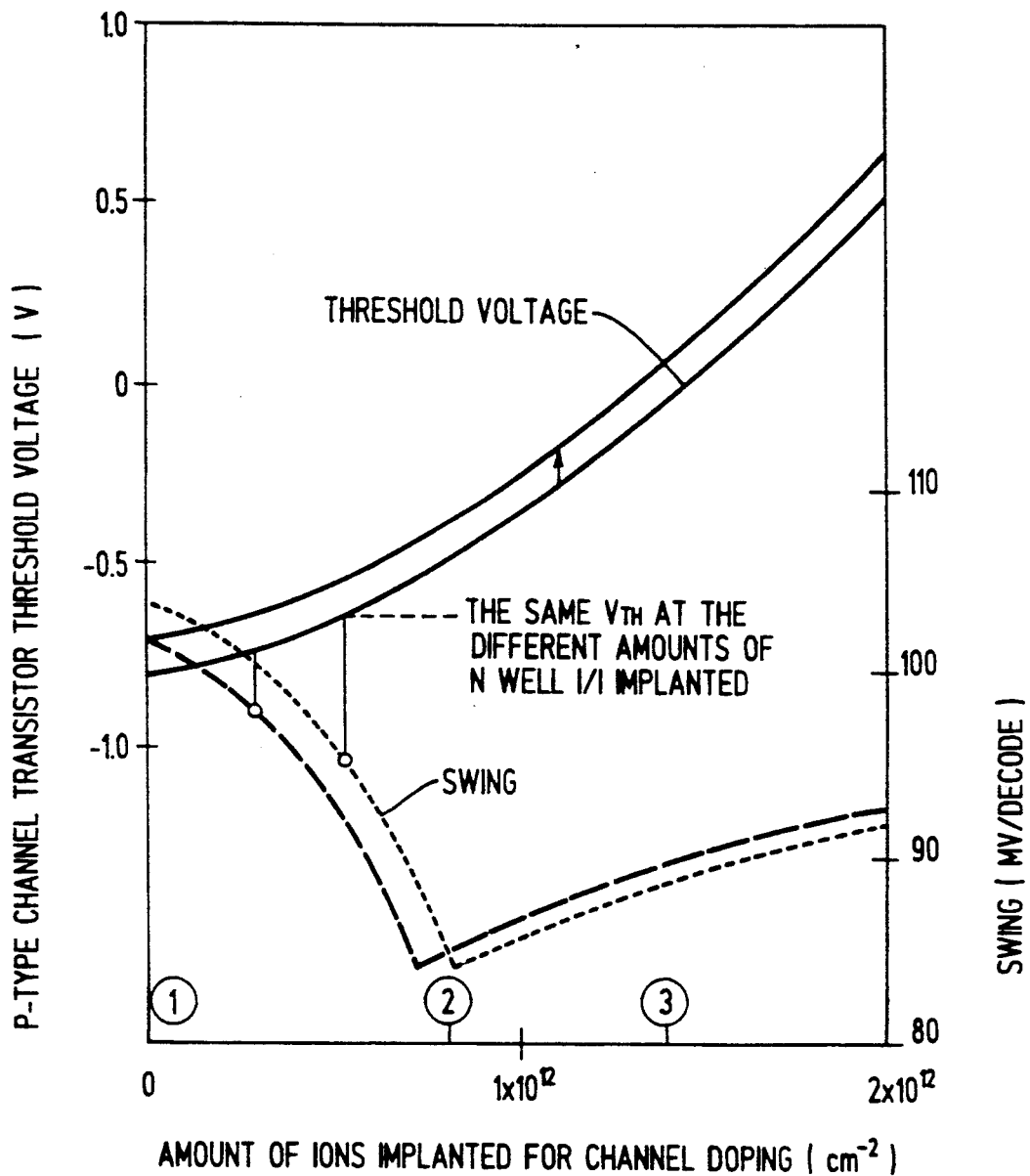
FIGS. 2 and 2a are diagrams showing the relationship between the concentration of ions implanted for channel doping, the threshold voltage and the swing characteristic, illustrating the approach of the present invention.

FIG. 2 is a diagram showing, on the basis of measured data, the relationship between the threshold voltage and the swing value (indicated by the broken line) which correspond to the amount of ions implanted for channel doping for the MIS transistor used for the simulation shown in FIG. 3. In FIG. 2, the abscissa represents the amount of ions implanted for channel doping and the ordinate represents the threshold voltage (on the left hand side) and the swing value (on the right hand side), the swing value being, as noted above, the change in gate voltage required to vary the drain current by a factor of 10.

As is obvious from FIG. 2, the threshold voltage increases monotonically with an increase in the amount of ions implanted for channel doping, while the swing value decreases with the increase in the amount of ions implanted and reaches the minimum (point E) when a predetermined amount of ions is implanted, and thereafter increases with further increases in the amount of ions implanted.

FIG. 2 further shows that value as the amount of ions implanted is decreased, the threshold voltage, $V_{TH}$ increases and the swing value curve shifts to the left so that swing values in the descending portion of the curve decrease and swing values in the ascending portion of the curve increase.

Figure 2A:
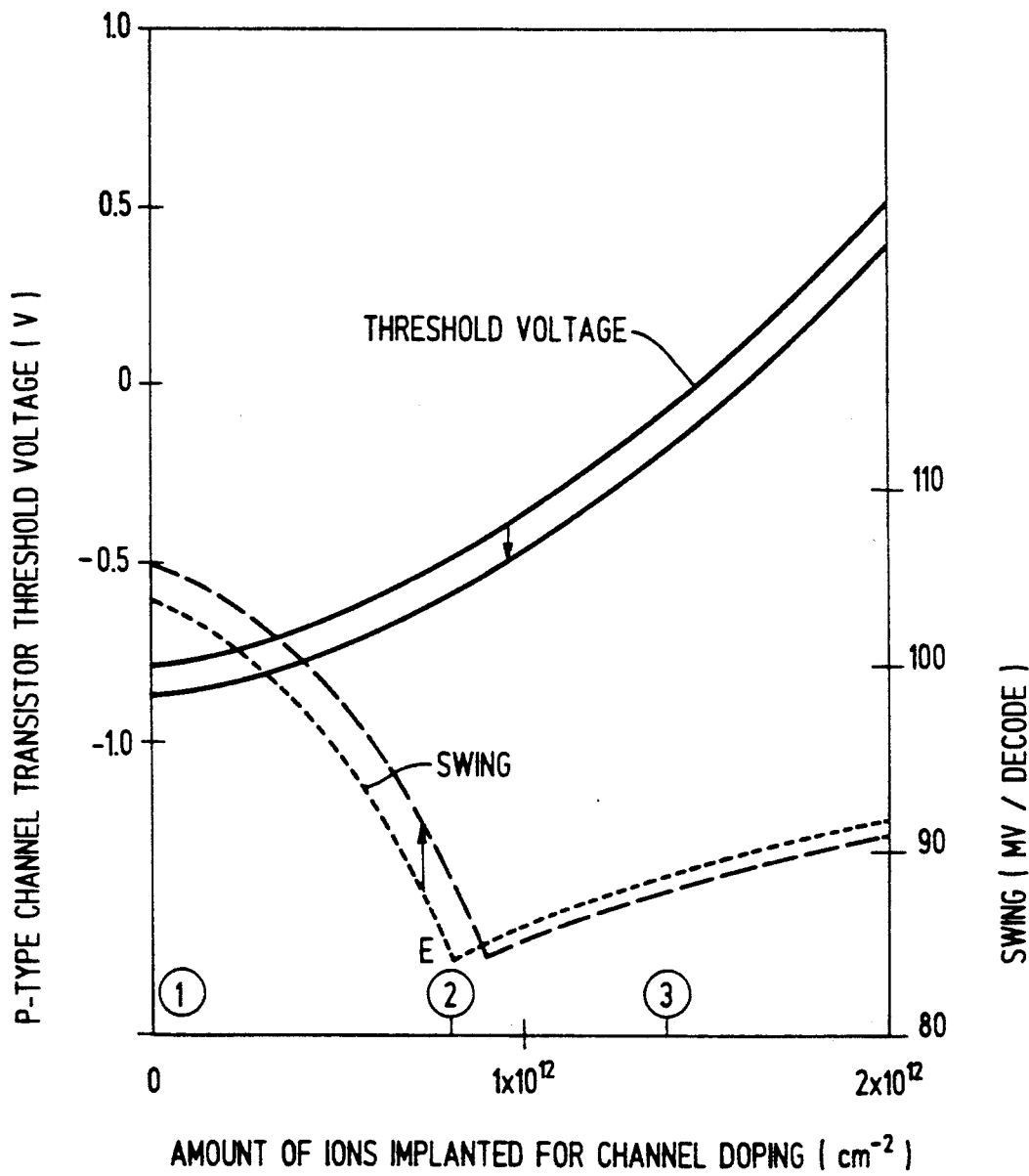

FIG. 2a shows the corresponding variations which occur when the amount of ions implanted is increased.

Comparison between FIGS. 2 and 3 shows that the swing takes the lowest value in the vicinity of the deepest depression of the impurity density of the n well shown in FIG. 3 at which ions are implanted at a dose of $7.5 \times 10^{11}$ cm$^{-2}$.

FIG. 3 further shows that if an n well does not exist, the impurity density represented by curve 1 shifts down by an amount determined by the substrate density of the wafer.

When an n well is present in a transistor, the impurity density is approximately between $1 \times 10^{16}$ and $3 \times 10^{16}$ cm$^{-3}$. When a p well is present, the impurity density is approximately between $2 \times 10^{16}$ and $6 \times 10^{16}$ cm$^{-3}$.

Further, as shown in FIGS. 2 and 2a, the amount of implantation corresponds to a transistor threshold voltage, $V_{TH}$, of between $-0.5$ and $-0.7$ V and exemplary ion implantation amounts are between about $7 \times 10^{11}$ and $1.2 \times 10^{12}$ cm$^{-2}$.

Figure 4:
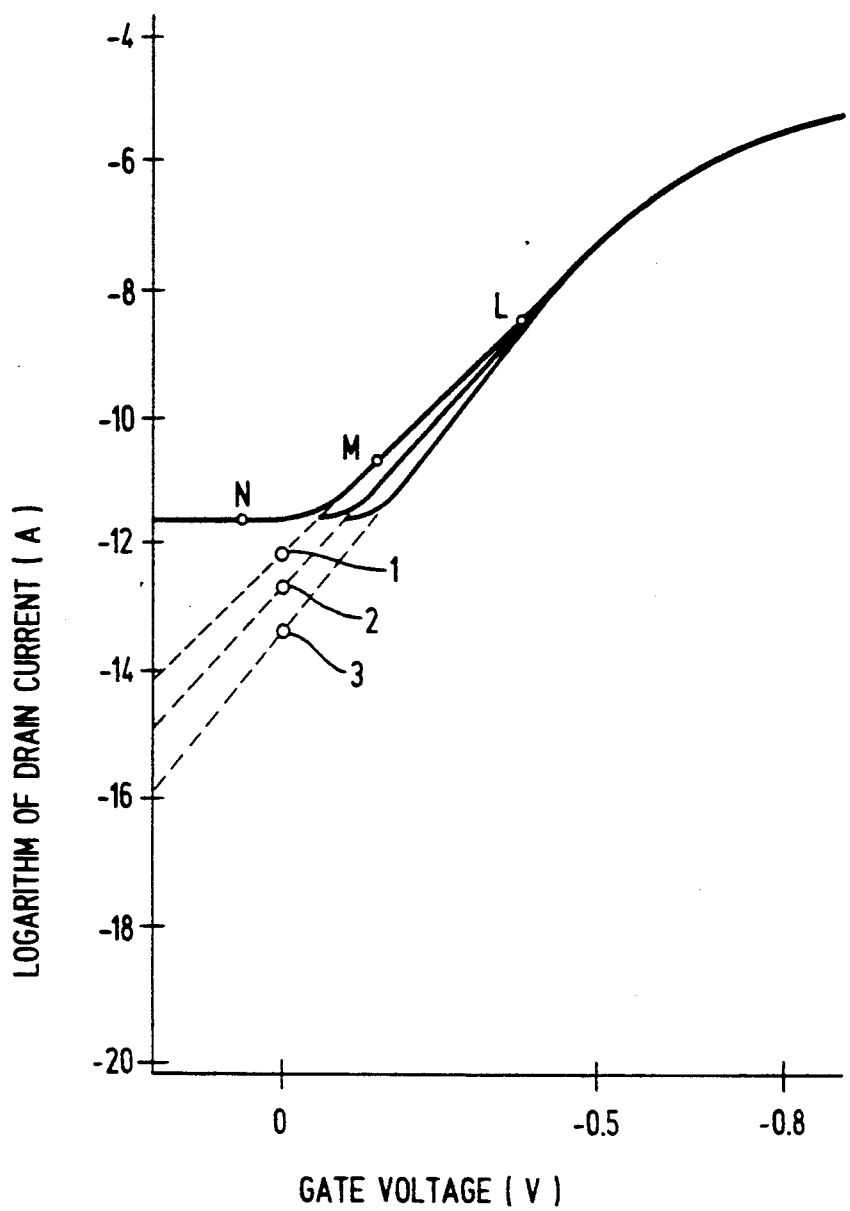
FIG. 4 is a characteristic curve showing the relationship between swing value and cut-off current of MIS transistors doped according to the present invention.

FIG. 4 is a set of characteristic curves of the drain current with respect to the gate voltage measured for calculating the swing value. The abscissa represents the gate voltage in the sub-threshold region and the ordinate represents the logarithm of the drain current. FIG. 4 does not have a direct one-to-one correspondence with FIG. 2, but shows the relationship between the swing value and the cut-off current of a p—type channel MIS transistor having a threshold voltage ($V_{TH}$) of $-0.5$ V. The curves 1, 2 and 3 in FIG. 4, respectively, correspond to three p-type channel transistors which all have a threshold voltage ($V_{TH}$) of $-0.5$ V but have different swing values depending upon a combination of the amount of ions implanted to the n well and the amount of channel doping ions implanted.

In FIG. 4, the solid lines are based on measured values. With respect to the curve 1, for example, the region of the point N represents a part saturated by the measurement limitation of measurement equipment. The broken line portion is obtained by extrapolating the straight solid line portion which contains the points L and M in the curve 1 to the region in which the gate voltage $V_G=0$ and approximating the results to a straight line. Similarly, approximate straight broken line portions are derived with respect to curves 2 and 3.

The swing value is the reciprocal of the gradient of the approximate straight line. The curves 1, 2 and 3 correspond to the transistors having swing values of 100, 90 and 80 mV/decade, respectively.

From FIG. 4, it is clear that when the threshold value is $-0.5$ V, for example, the lower the swing value, the more it is possible to reduce the cut-off current indicated by the hollow circle on each curve.

Figure 5:
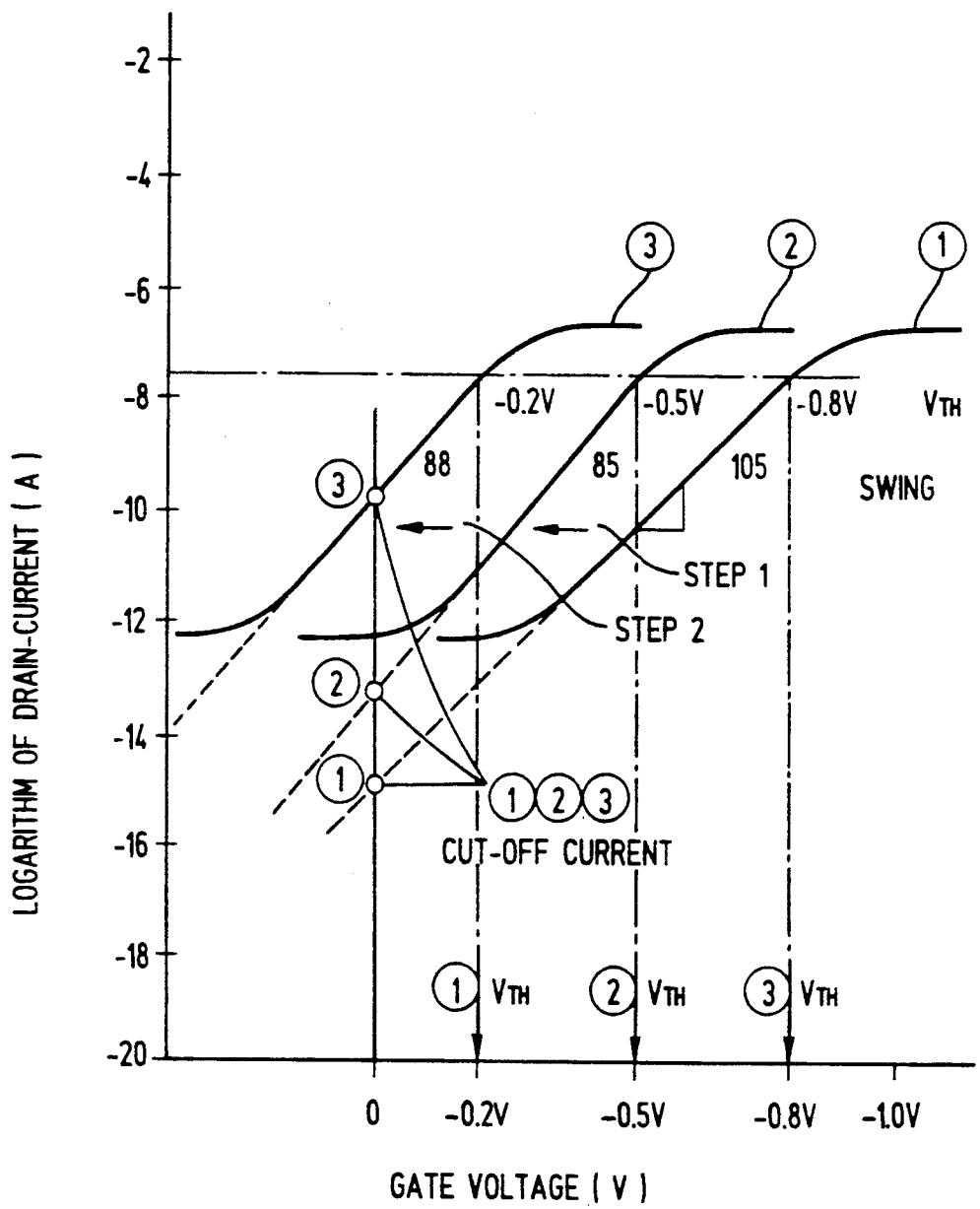
FIG. 5 is a characteristic curve of the relationship between drain current and gate voltage and showing the relationship between swing value and cut-off current in correspondence with FIG. 1.

The relationship between the swing value and the cut-off current which corresponds to FIG. 2 will now be explained with reference to the characteristic curve of drain current vs. gate voltage shown in FIG. 5. In FIG. 5, the abscissa represents the gate voltage and the ordinate the logarithm of the drain current. The solid lines show measured values and the broken lines represent approximate straight lines derived by extrapolation.

The curves 1, 2 and 3 in FIG. 5 are obtained when the amounts of boron channel doping ions in FIG. 2 are 0, $8 \times 10^{11}$ cm$^{-2}$ and $1.4 \times 10^{12}$ cm$^{-2}$, respectively. The swing values and the threshold voltages $V_{TH}$ thereof correspond to 105 and $-0.8$ V, 85 and $-0.5$ V and 88 and $-0.2$ V, respectively. The swing values are calculated from the reciprocal of the gradient of the approximate straight line in the same way as in FIG. 4. The threshold voltage is the gate voltage existing when the logarithm of the drain current is −7 ($I_D=10^{-7}$ A), for example the threshold voltage is −0.8 V in the curve 1.

As shown in FIG. 5, when the threshold voltage $V_{TH}$ is reduced from −0.8 V to −0.2 V with the increase in the amount of channel doping ions as from step 1 to step 2, the characteristic curves shift from the right to the left, namely, from 1 to 3, so that the cut-off current positively increases. Therefore, increase in the absolute value of the threshold voltage $V_{TH}$ is the most effective for the reduction of the cut-off current. It is not always possible, however, to increase the threshold voltage $V_{TH}$ due to various restrictions. In FIG. 5, the optimum conditions for reducing the cut-off current when the threshold voltage $V_{TH}$ is −0.5 V are obtained by selecting the amount of channel doping ions which reduces the swing value in accordance with the present invention. In order to obtain a threshold voltage $V_{TH}$ of −0.5 V, for example, various combinations of the impurity density of the well (if there is no well, then the impurity density of the substrate) and the amount of channel doping ions will be considered. Among them, selection of the amount of channel doping ions which is capable of reducing the swing value approximately to the minimum leads to the desired reduction in the cut-off current.

Figure 6:
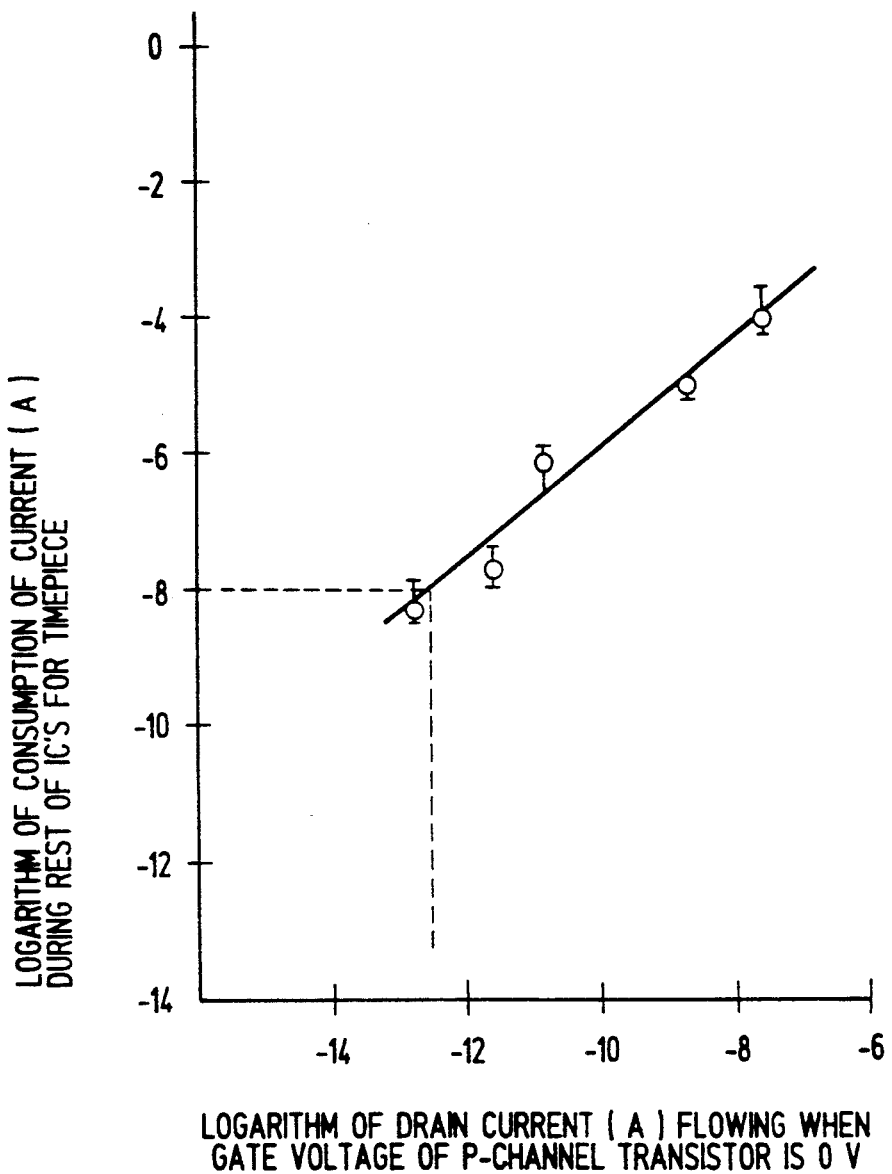
FIG. 6 is a diagram showing the relationship between current consumption in an IC and cut-off current in one transistor during a rest of an MIS transistor, used to explain the present invention.

FIG. 6 is a diagram showing the relationship between the cut-off current and the consumption of current during a rest of a transistor employed in ICs for a timepiece, thereby illustrating the present invention. The abscissa represents the logarithm of the drain current flowing when the gate voltage is 0 V, namely the cut-off current, for a single transistor and the ordinate represents the logarithm of the consumption of current during a rest for an entire IC. The threshold voltage, $V_{TH}$, swing and cut-off current are characteristics of each individual transistor, while the consumption of current during a rest is a characteristic of an IC containing a plurality of transistors. While a direct linear relation exists between cut-off current, as shown in FIG. 6, such a relation does not exist between $V_{TH}$ and consumption of current during a rest. For a given value of $V_{TH}$, the cut-off current has different values for different swing values, which results in a change in current consumption during a rest. This is illustrated by the following comparison between two transistors, A and B.

|  | Vth | swing | cut-off current | consumption of current of IC during rest |
|---|---|---|---|---|
| TrA | 0.5v | small | small | small |
| TrB | 0.5v | large | large | large |

The cut-off currents and the consumptions of current of transistors having threshold voltages $V_{TH}$ of −0.3 to 0.7 V for ICs having five different threshold voltages $V_{TH}$ were measured. From FIG. 6, it is obvious that the cut-off current and the consumption of current during a rest correspond to each other with a constant relationship. That is, if the swing value is restricted to a small value, it is possible to restrict the increase in the cut-off current to the smallest limitation and, as a result, to reduce the consumption of current during a rest, thereby lowering the total consumption of current.

As described above, the swing value at a predetermined threshold voltage is preferably as small as possible. The desirable range of the swing value will be more concretely defined herebelow.

In the transistors for ICs for timepieces such as those shown in FIG. 6, transistors in which the consumption of current during a rest is not more than $10^{-8}$ are generally considered to be good products. In this case, the logarithm of the cut-off current is about −12.4 to −12.5. Therefore, the logarithm of the cut-off current in the ICs for timepieces shown in FIG. 6 is preferably smaller than about −12.4 to −12.5.

The transistors used for collecting the data in FIG. 4 have characteristics similar to those of the transistors shown in FIG. 6.

It is obvious from FIG. 4 that among the p-type channel transistors which have a threshold voltage ($V_{TH}$) of −0.5 V but show different swing values, the transistors in which the logarithm of the cut-off value is smaller than −12.4 to −12.5 shown a swing value smaller than about 98 to 95 mV/decade.

As a result of examining transistors having other characteristics to calculate the optimum swing value thereof, it has been found that a swing value less than 100 mV/decade is preferable for reducing the consumption of current during a rest. More specifically, a swing value not more than 95 mV/decade is more preferable.

That is, transistors having the minimum or close to the minimum swing value in the smallest consumption of current during a rest. Generally, even if the swing value is not the minimum, it is preferably not more than 95 mV/decade or less than 100 mV/decade.

By applying the results obtained to FIG. 2, it can be said that the swing value is preferably in the range between the minimum value and about 15% above the minimum value.

In this embodiment, a p-type channel MIS type transistor having an n well is cited as an example, but the present invention may be applicable to an MIS type transistor having no well and an n-type channel MIS type transistor in the same way as in this embodiment. Although p+ polysilicon is used for the gate electrode in this embodiment, n+ polysilicon, polycide having a laminate structure of polysilicon and silicide of a later-described refractory metal, silicide of a later-described refractory metal, silicide of a later-described refractory metal, a refractory metal such as Ti, W, Ta, Mo, Nb and Pt, aluminum, aluminum alloy obtained by alloying aluminum with Si or CU are also usable. In addition, boron is used as the channel doping ions in this embodiment, but elements of the IIIA and VA groups are also usable.

As described above, a method of producing an MIS type semiconductor device having a channel doping structure according to the present invention enables the increase in the drain current flowing when the gate voltage is 0 V, namely the cut-off current, to be restricted to the minimum by controlling the amount of channel doping ions implanted so that the change in the gate voltage which is required for changing the drain current value in the sub-threshold region by one order of magnitude, in other words the swing value is not more than slightly greater than 90 mV/decade or less than 100 mV/decade, or in the range of the minimum to an excess of about 15% over the minimum. Thus, the method of the present invention has the effect of reducing the consumption of power due to the reduction in the consumption of current during a rest.

Further information about the relation between channel doping ion implantation and swing in a p channel transistor having an n+ type polycrystalline silicon gate electrode can be found in *IEEE Transactions on*

*Electron Devices*, Vol. ED-33, No. 1, January 1986, pages 148-153.

While there has been described what is at present considered to be a preferred embodiment of the invention, it will be understood that various modifications may be made thereto, and it is intended that the appended claims cover all such modifications as fall within the true spirit and scope of the invention.

What is claimed is:

1. A method of producing a p-channel MIS transistor having a first region composed of a semiconductor substrate or a wall having n-conductivity type impurities, source and drain regions having p-conductivity type impurities and which are formed in said first region with a space between said source region and said drain region, and a p-conductivity type polysilicon gate electrode formed between said source region and drain region and above said first region, said first region having a channel portion between said source and drain regions, in which portion doping ions are to be implanted, said method comprising the steps of:

determining the distribution characteristic of the impurity density of said first region with respect to the depth of said first region which have the amount of ions implanted for channel doping as a parameter;

determining the swing value of the transistor on the basis of the determined distribution characteristic, which swing value is the change in the gate voltage which is required for changing the value of the drain current by one order of magnitude in the subthreshold region from the gate voltage - drain current characteristic, the transistor having a swing value which is dependent on the amount of channel doping ions implanted, such that the swing value decreases to a finite minimum obtainable value as the amount of channel doping ions is increased to a predetermined amount and the swing value increases from the finite minimum obtainable value as the amount of channel doping ions implanted is increased above the predetermined amount; and implanting ions in the channel portion at a dose which is selected in accordance with the impurity density of said first region for reducing said swing value to substantially the minimum obtainable.

2. A method according to claim 1 wherein the amount of channel doping ions implanted is selected so that said swing value is less than 100 mV/change in drain current by a factor of 10.

3. A method as defined in claim 2 wherein the amount of channel doping ions implanted is selected so that said swing value is less than 95 mV/change in drain current by a factor of 10.

4. A method according to claim 1 wherein said channel doping ions are of p-conductivity type.

* * * * *